United States Patent [19]
Hwang et al.

[11] Patent Number: 6,162,700
[45] Date of Patent: Dec. 19, 2000

[54] METHOD OF FORMING A TRENCH ISOLATION STRUCTURE IN A SEMICONDUCTOR SUBSTRATE

[75] Inventors: Ki Hyun Hwang; Byung-Ki Kim, both of Kyungki-do, Rep. of Korea

[73] Assignee: Samsung Electronics Co., Ltd., Suwon, Rep. of Korea

[21] Appl. No.: 09/190,803

[22] Filed: Nov. 11, 1998

[30] Foreign Application Priority Data

Nov. 11, 1997 [KR] Rep. of Korea ............ 97-59260

[51] Int. Cl.[7] .................... H01L 21/76; H01L 21/31
[52] U.S. Cl. ............................... 438/424; 438/761
[58] Field of Search ........................ 438/424, 761

[56] References Cited

U.S. PATENT DOCUMENTS 5,580,815 12/1996 Hsu et al. .
5,877,095 3/1999 Tamura et al. .
5,968,611 10/1999 Kaloyeros et al. .

*Primary Examiner*—Charles Bowers
*Assistant Examiner*—Josetta Jones
*Attorney, Agent, or Firm*—Skjerven Morrill MacPherson LLP; David T. Millers

[57] ABSTRACT

A method of forming a trench isolation structure includes a low pressure chemical vapor deposition (LPCVD) that forms a silicon rich nitride layer as a mask for etching a semiconductor substrate. The LPCVD uses a mixed gas containing at least two different silicon compounds in a silicon source gas. The method can prevent deterioration of gate oxide layer reliability, and enhance an in-wafer and batch uniformity of the silicon rich nitride layer.

14 Claims, 2 Drawing Sheets

20

METHOD OF FORMING A TRENCH ISOLATION STRUCTURE IN A SEMICONDUCTOR SUBSTRATE

FIELD OF THE INVENTION

The present invention relates to methods for fabricating semiconductor devices, and more particularly to methods for forming trench isolation structures using nitride etch masks.

BACKGROUND OF THE INVENTION

The isolation of devices on a semiconductor substrate is important because improper device isolation can cause current leakage that consumes significant amounts of power. In addition, improper device isolation can cause latch-up that momentarily or permanently damages circuit functions. Still further, improper device isolation can degrade noise margins, shift voltages, or cause crosstalk in an integrated circuit (IC).

A conventional LOCOS (local oxidation of silicon) device isolation process includes ion-implantation for channel stops and growth of thick field oxide regions that laterally isolate the active device regions of an IC. For ion implantation and oxide growth, the LOCOS process typically uses a mask including a silicon nitride layer and an underlying pad oxide that are patterned to cover the active device regions. The pad oxide layer releases stress that the silicon nitride layer causes during the LOCOS process. Resulting LOCOS isolation structures have some drawbacks. In particular, lateral oxidation of the silicon under the silicon nitride mask makes the edge of each field oxide region resemble the shape of a bird's beak, and the lateral diffusion of channel-stop dopants causes the dopants to encroach into the active device regions. These effects increase transistor threshold voltages, reduce current driving capabilities, and reduce active device areas. Therefore, the effects can be serious problems when devices are scaled down for very large scale integration (VLSI).

An isolation technique using shallow trenches has been developed in an attempt to avoid the drawbacks of the LOCOS isolation structure. Generally, the shallow trench isolation (STI) fabrication process includes depositing a silicon nitride layer over a semiconductor substrate, for example, using low pressure chemical vapor deposition (LPCVD) with a flow of dichlorosilane ($SiH_2Cl_2$, hereinafter referred to "DCS") and ammonia ($NH_3$) in a ratio of 1:10. The silicon nitride layer is then patterned, and etching of exposed portions of the semiconductor substrate forms trenches. A trench filling insulating layer is then deposited over the semiconductor substrate, before a high temperature annealing process removes defects resulting from etching the semiconductor substrate and depositing the insulating layer.

Undesirably, this trench isolation process applies a residual tensile stress of about $1.3 \times 10^{10}$ dyne/cm$^2$ or more to the active region of the semiconductor substrate during the high temperature annealing. The stress can cause a dislocation defect. Such a defect reduces reliability of the gate oxide layers and degrades refresh characteristics in memory circuits such as dynamic random access memories (DRAMs). To address the problem of stress, silicon rich nitride layers exhibiting low residual tensile stress can be employed as an etch mask for trench formation. However, to form a silicon rich nitride layer exhibiting stress that is less than $3 \times 10^9$ dyne/cm$^2$, the flow ratio of DCS to $NH_3$ must be larger than 5 to 1. FIG. 1 shows the relationship between the residual tensile stress of the silicon nitride layer and the reactant gas flow ratio of DCS to $NH_3$. The large quantity of DCS introduced to form the desired silicon rich nitride also forms unacceptably large quantities of particles (typically $NH_4Cl$) from reactions between $NH_3$ and decomposition by-products of DCS, i.e., HCl.

HCl is not formed if $SiH_4$ (silane) is the silicon source gas instead of the DCS, but $SiH_4$ causes other problems. With $SiH_4$, decreasing the in-wafer uniformity of a nitride layer down to less than 5% is difficult, and the number of wafers that can be processed per batch decreases due to different uniformities of nitride layers on different wafers. Improving batch uniformity requires increasing the temperature slope in the reacting chamber, which results in variations in characteristics of the nitride layer, thereby affecting wet and dry etching rates of the nitride layer.

SUMMARY OF THE INVENTION

The present invention provides an improved method of employing a silicon rich nitride layer as a mask when forming a trench isolation structure in a semiconductor device. In accordance with an aspect of the invention, an LPCVD method of forming the silicon nitride layer uses a mixed gas containing at least two different compounds as silicon sources.

Accordingly, an object of the present invention is to provide a silicon rich nitride layer having residual tensile stress less than about $3 \times 10^9$ dyne/cm$^2$ for a trench forming mask.

A further object of the invention is to provide a method of forming trench isolation structures in a semiconductor substrate without harming the reliability of a gate oxide layer.

Yet another object of the invention is to provide a method that reduces wafer contamination and improves in-wafer and batch uniformity of silicon rich nitride layers when forming trench isolation structures in semiconductor substrates.

Other aspect, objects, and the several advantages of the present invention will be more apparent from a reading of the following disclosure and appended claims.

In accordance with one embodiment of the invention, a method begins by forming a pad oxide layer over a semiconductor substrate. An LPCVD process then forms a silicon rich nitride layer on the pad oxide layer. The LPCVD process uses mixed gas containing DCS and $SiH_4$ as silicon sources and $NH_3$ as a nitrogen source. Portions of the silicon rich nitride layer and pad oxide layer are etched to form an etch mask. Portions of the semiconductor substrate that the etch mask exposes are then etched to form trenches. An insulating layer is deposited in the trench to a thickness sufficient to withstand a planarization process. High temperature annealing at about 1150° C. removes defects resulting from etching the semiconductor substrate and depositing the insulating layer. A planarization process is conducted on the insulating layer thereby to form trench isolation.

In one specific embodiment, a process for forming the silicon rich nitride layer has DCS and $SiH_4$ as silicon sources, $NH_3$ as a nitrogen source, and flow rate ratios DCS:$NH_3$ and DCS:$SiH_4$ are respectively equal to 1:10 and 1:0.1. An advantage of this embodiment of the invention is that DCS and $SiH_4$ as silicon sources can form the silicon rich nitride layer of the desired tensile strength without raising the flow ratio DCS:$NH_3$ about up to 5:1 which brings about wafer contamination by DCS decomposition by-products, e.g., $NH_4Cl$ particles. Another advantage is that the inventive process forms the silicon rich nitride layer without using $SiH_4$ alone and thereby avoids poor in-wafer and batch uniformity in the silicon rich nitride layer.

DETAILED DESCRIPTION

The preferred embodiment of the present invention will now be described with reference to the accompanying drawings.

Figure 1:
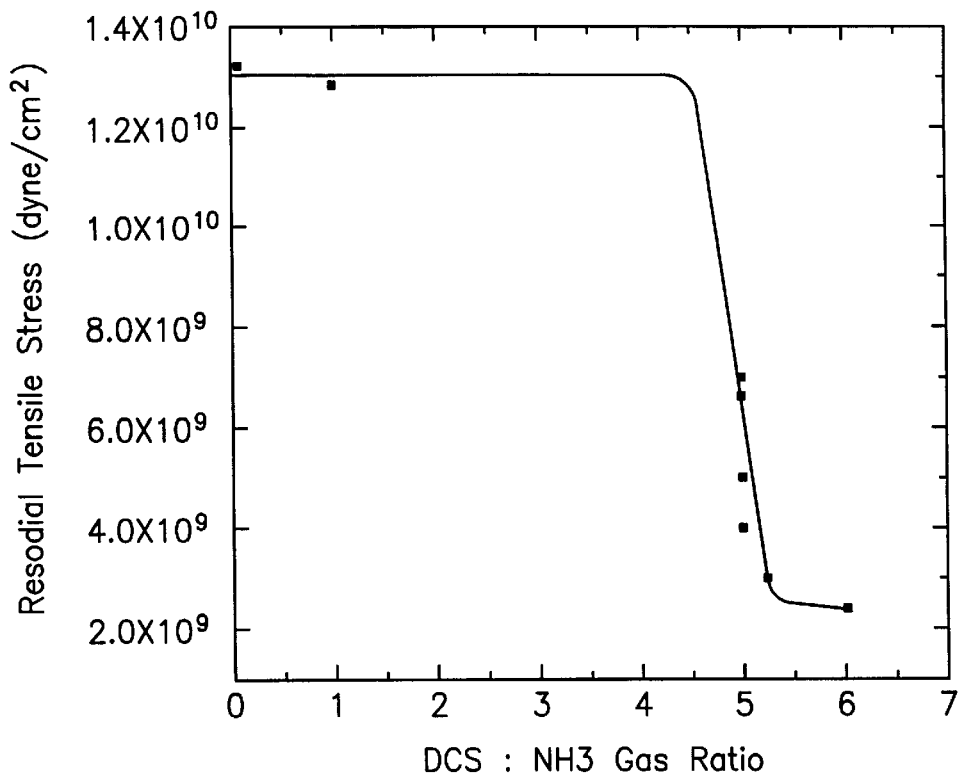
FIG. 1 is a graph showing the relationship between the residual tensile stress of the silicon nitride layer and the reactant gas flow ratio DCS:NH$_3$ according to a prior art method.
Figure 2:
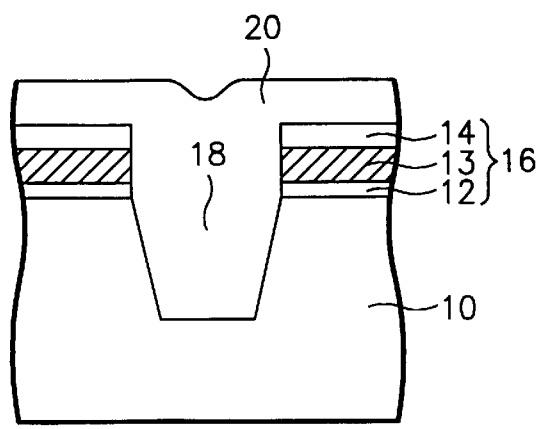
FIG. 2 is a cross-sectional view showing a trench isolation structure according to an embodiment of the present invention.

FIG. 2 shows a cross-sectional view of a trench isolation structure according to an embodiment of the present invention. A process for forming the trench isolation structure forms a pad oxide layer 12 over a semiconductor substrate 10. The pad oxide layer 12 can be grown or deposited using a conventional method. An LPCVD (low pressure chemical vapor deposition) process forms a silicon rich nitride layer 13 over the pad oxide layer 12 in a manner that reduces residual tensile stress and avoids deterioration of the reliability of a later formed gate oxide layer. The LPCVD method of this invention uses mixed gas containing DCS and SiH$_4$ as silicon sources and NH$_3$ as a nitrogen source. Herein, silicon rich nitride layer 13 has a typical chemical composition Si$_x$N$_y$, where x is equal to or larger than y. For example Si$_4$N$_4$, has a sufficiently high silicon content relative to nitrogen.

Conventional processes form a silicon nitride layer with a flow ratio DCS:NH$_3$ equal to 1:10. However, conventional processes typically require a flow ratio DCS:NH$_3$ of more than 5:1 in order to form a silicon rich nitride layer exhibiting stress that is less than 3×10$^9$ dyne/cm. As indicated above, the high flow ratio (5:1) leads to unacceptable levels of DCS decomposition by-products, such as NH$_4$Cl particles that contaminate the silicon wafer. Using SiH$_4$ to avoid the decomposition by-products causes poor in-wafer and batch uniformity. To solve both problems, a process in accordance with the present invention mixes DCS and SiH$_4$ as silicon sources. Herein, the flow ratio DCS:NH$_3$ is 1:10, the same ratio as in the conventional process for forming the silicon nitride layer. This avoids DCS decomposition by-products, but in order to form the silicon rich nitride layer, small amounts of SiH$_4$ are added as a supplementary silicon source. At this time, the flow ratio DCS:SiH$_4$ is 1:0.1. SiH$_4$ and DCS are introduced into the reaction chamber through a main injector after being mixed outside the reaction chamber. Additionally, SiH$_4$ can be further introduced into the reaction chamber through an auxiliary injector so as to improve batch uniformity of the silicon rich nitride layer. Further more, to improve in-wafer uniformity of the silicon rich nitride layer, a ring-boat known well in the art can be used. Alternatively, the wafer can be rotated.

Figure 3:
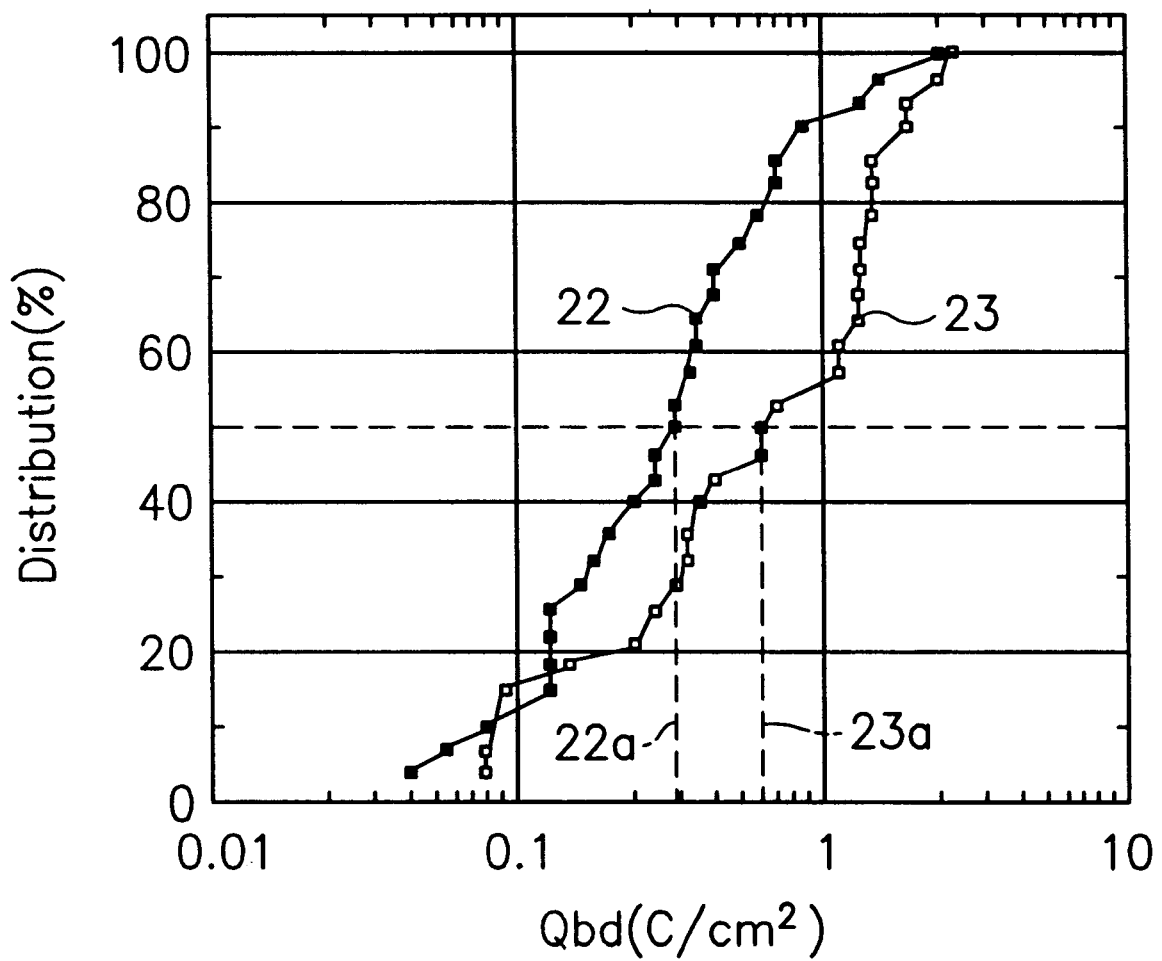
FIG. 3 is a graph illustrating the relationship between reliability of a gate oxide layer and the composition ratio of the silicon nitride layer.

Referring to FIG. 2, after forming silicon rich nitride layer 13 as described above, a high temperature oxide (HTO) layer 14 is formed on silicon rich nitride layer 13. Sequential etching partly removes HTO layer 14, silicon rich nitride layer 13, and pad oxide layer 12 so as to expose portions of substrate 10 and form a trench forming mask. Etching of semiconductor substrate 10 where exposed by the mask forms a trench 18. After that, a trench filling insulating layer 20 is deposited in trench 18 to such a thickness that a subsequent planarization process does not produce defects due to an insufficient thickness of insulating layer 20. An undoped silicate glass (USG) can be a material for trench filling insulating layer 20. A high temperature annealing process at 1150° C. or higher removes defects such as a seam of trench filling layer 20 and reduces the residual tensile stress in silicon rich nitride layer 13 to 3×10$^9$ dyne/cm or less. Finally, planarization of trench filling insulating layer 20 and then removal of the trench-forming mask 16 complete a trench isolation. This method reduces the residual tensile stress of the silicon rich nitride layer to about 3×10$^9$ dyne/cm$^2$ or less and thus avoids such defects as dislocations and degradation of the gate oxide layer reliability FIG. 3 is a graph showing a relationship between the gate oxide layer reliability and a composition of the silicon nitride layer used in a mask for forming trench isolation structures. Reference number 22 represents a conventional Si$_3$N$_4$ silicon nitride layer, and reference number 23 represents a silicon rich nitride layer having a composition ratio of Si$_4$N$_4$ in accordance with an embodiment of the present invention. In FIG. 3, the X-axis represents a breakdown charge concentration, i.e., Qbd in C/cm$^2$, of a gate oxide layer, and the Y-axis represents a distribution percentage for the breakdown of a gate oxide layer. As shown, a gate oxide layer formed after the conventional silicon nitride layer 22 causes a 50% distribution of breakdown at 0.3 C/cm$^2$ (22a), but a gate oxide layer formed after silicon rich nitride layer 23 does not reach the 50% distribution until reaching a charge concentration of 0.6 C/cm$^2$ (23a).

In summary, the invention forms a silicon rich nitride layer having low residual tensile stress, so that deterioration of gate oxide layer reliability can be avoided. Further, an LPCVD process using a mixed gas containing DCS and SiH$_4$ as silicon source gas can form the silicon rich nitride layer having low residual tensile stress without disturbing the uniformity of the silicon rich nitride layer.

Although the invention has been described with reference to particular embodiments, the description is an example of the invention's application and should not be taken as a limitation. Various adaptations and combinations of the features of the embodiments disclosed are within the scope of the invention as defined by the following claims.

What is claimed is:

1. A method of forming a trench isolation structure using a nitride etch mask, the method comprising:

forming a pad oxide layer on a semiconductor substrate; and depositing a silicon rich nitride layer on the pad oxide layer through a low pressure chemical vapor deposition (LPCVD) method, wherein the LPCVD method uses a mixed gas containing at least two different gases as a silicon source.

2. The method according to claim 1, wherein the silicon rich nitride layer is Si$_x$N$_y$, and x is equal to or larger than y.

3. The method according to claim 1, wherein the mixed gas comprises SiH$_2$Cl$_2$ (dichlorosilane) and SiH$_4$ (silane), as the silicon source, and NH$_3$ (ammonia) as a nitrogen source.

4. The method according to claim 3, wherein a flow ratio of the SiH$_2$Cl$_2$ to SiH$_4$ is 1:0.1.

5. The method according to claim 3, wherein a flow ratio of the SiH$_2$Cl$_2$ to NH$_3$ is 1:10.

6. A method of forming a trench isolation structure using a nitride etch mask, the method comprising:

forming a pad oxide layer on a semiconductor substrate;

forming a silicon rich nitride layer over the pad oxide layer using a low pressure chemical vapour deposition (LPCVD) method, wherein the LPCVD method used to form the silicon rich nitride layer uses a mixed gas containing at least two different gases as a silicon source and a gas as a nitrogen source, and wherein, in the silicon rich nitride layer, silicon content is greater than any other element content;

removing portions of the silicon rich nitride layer and the pad oxide layer so as to form a mask;

etching the semiconductor substrate exposed through the mask to form a trench:

depositing an insulating layer in the trench; and performing a high temperature annealing process on the trench filling insulating layer.

7. The method according to claim 6, wherein the silicon source comprises dichlorosilane ($SiH_2Cl_2$) and silane ($SiH_4$), and the nitrogen source comprises ammonia ($NH_3$).

8. The method according to claim 7, wherein a flow ratio of the dichlorosilane ($SiH_2Cl_2$) to silane ($SiH_4$) is 1:0.1.

9. The method according to claim 7, wherein a flow ratio of the dichlorosilane ($SiH_2Cl_2$) to ammonia ($NH_3$) is 1:10.

10. A method of forming a silicon nitride layer, comprising:

introducing a flow of a silicon source gas into a reaction chamber, wherein the silicon source gas contain at least two different silicon compounds;

introducing a flow of a nitrogen source gas into the reaction chamber; and forming the silicon rich nitride layer through a reaction of the silicon source gas and the nitrogen source gas in the reaction chamber.

11. The method according to claim 10, wherein the silicon rich nitride layer is $Si_xN_y$, and x is equal to or larger than y.

12. The method according to claim 10, wherein the nitrogen source gas comprises $NH_3$.

13. The method according to claim 10, wherein the at least two different silicon compounds comprise dichlorosilane ($SiH_2Cl_2$), and silane ($SiH_4$).

14. The method according to claim 13, wherein a flow ratio of the dichlorosilane ($SiH_2Cl_2$) to silane ($SiH_4$) is 1:0.1.

* * * * *